(12) United States Patent
Watanuki (10) Patent No.: US 7,409,064 B2
(45) Date of Patent: Aug. 5, 2008

(54) MUSIC REPRODUCTION APPARATUS, AUDIO PLAYER, AND HEADPHONE

(75) Inventor: Masanori Watanuki, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/723,552

(22) Filed: Mar. 21, 2007

(65) Prior Publication Data

US 2007/0162169 A1 Jul. 12, 2007

Related U.S. Application Data (62) Division of application No. 09/963,578, filed on Sep. 27, 2001, now abandoned.

(30) Foreign Application Priority Data

Oct. 2, 2000 (JP) .............................. 2000-302666

(51) Int. Cl.
 - H04R 1/10 (2006.01)
 - H04R 5/02 (2006.01)
 - H04R 1/02 (2006.01)
 - H04B 7/00 (2006.01)
 - H04M 1/00 (2006.01)
 - G06F 17/00 (2006.01)

(52) U.S. Cl. .................... 381/74; 381/311; 381/334; 455/556.1; 455/41.2; 455/3.06; 455/575.2; 455/66.1; 700/94

(58) Field of Classification Search ................ 381/1, 381/74, 311, 334, 374, 370, 381, 375; 455/574, 455/343.5, 556.1, 41.2, 3.06, 575.2, 570, 455/66.1; 700/94

See application file for complete search history.

(56) References Cited

U.S. PATENT DOCUMENTS

| | | | |
|---|---|---|---|
| 4,484,029 A | | 11/1984 | Kenney |
| 4,845,751 A | * | 7/1989 | Schwab ....................... 381/311 |
| 5,787,166 A | | 7/1998 | Ullman |
| 6,301,367 B1 | * | 10/2001 | Boyden et al. .............. 381/376 |
| 6,381,452 B1 | | 4/2002 | Tien |
| 6,519,448 B1 | * | 2/2003 | Dress et al. ................ 455/41.2 |
| 6,728,518 B1 | | 4/2004 | Scrivens et al. |

OTHER PUBLICATIONS

Izawa et al., "Reproducing Apparatus," U.S. Appl. No. 09/761,695, filed Jan. 18. 2001.

* cited by examiner

*Primary Examiner*—Vivian Chin
*Assistant Examiner*—Devona E. Faulk
(74) *Attorney, Agent, or Firm*—Finnegan, Henderson, Farabow, Garrett & Dunner, L.L.P.

(57) ABSTRACT

A music reproduction apparatus comprises an audio player and a headphone. The audio player comprises a circular main body, a display panel provided at a front face of the main body, an operating switch rotatably provided at a periphery of the display panel, and a wireless communication antenna provided at a rear face of the main body. The headphone comprises a circular main body, a speaker provided at one face of the main body, a wireless communication antenna provided at the other face of the main body, and an ear hook provided at the outside of the main body.

1 Claim, 6 Drawing Sheets

MUSIC REPRODUCTION APPARATUS, AUDIO PLAYER, AND HEADPHONE

CROSS-REFERENCE TO RELATED APPLICATIONS

This application is a divisional of application Ser. No. 09/963,578, filed Sep. 27, 2001, now abandoned which is based upon and claims the benefit of priority from Japanese Patent Application No. 2000-302666, filed Oct. 2, 2000, both of which are incorporated herein by reference in their entirety.

BACKGROUND OF THE INVENTION

1. Field of the Invention

The present invention relates to a music reproduction apparatus that wirelessly connects a portable audio player and a headphone, and the audio player and headphone.

2. Description of the Related Art

Conventionally, in the portable audio player, the audio player and the headphone are connected to each other via a connection cord. This cord gets in the way of a user, and makes it difficult to use the audio player while enjoying sport such as when one goes jogging while listening to music, for example. A connection cord is required to connect such an audio player to another device, and degradation of sound quality occurs. If it is aimed to use the headphone for another purpose, the audio player cannot be used unless the cord has been connected again. Further, it is difficult to listen to the same music by a plurality of people while connecting a plurality of headphones to one audio player. It is necessary to provide a plurality of jacks at the audio player, and a structural restriction occurs.

Because of this, in recent portable audio players, a wireless type audio player is employed such that voice information is frequency-modulated in an analog manner, and the modulated information is delivered to the headphone wirelessly by using radio or infrared rays.

However, a conventional wireless portable audio player transmits voice information in an analog manner, and has a problem that sound quality is degraded. A conventional wireless portable audio player using infrared rays cannot connect a plurality of headphones because of its strong directivity. In addition, a conventional wireless portable audio player using frequency-modulation is not configured to connect a plurality of headphones yet. Further, in the conventional wireless type audio player, a combination of the audio player and headphone capable of making wireless communication is predetermined. It is not possible to freely connect the headphone to the audio player.

BRIEF SUMMARY OF THE INVENTION

It is an object of the present invention to provide a music reproduction apparatus which is free of sound quality degradation, and in which a plurality of people can listen to the same music by using a plurality of headphones.

It is another object of the present invention to provide an audio player and a headphone usable for other purposes, as well for use in a wireless connection.

According to one aspect of the present invention, there is provided an audio player comprising a circular main body, a display panel provided at one face of the main body, an operating switch rotatably provided at a periphery of the display panel, and a wireless communication antenna provided at the other face of the main body.

According to another aspect of the present invention, there is provided a headphone comprising a circular main body, a speaker provided on one face of the main body, a wireless communication antenna provided at the other face of the main body, and an ear hook provided at the main body.

According to another aspect of the present invention, there is provided a music reproduction apparatus comprising an audio player and a headphone connected to the audio player via a wireless digital data transmission channel, the audio player comprising a transmitter configured to transmit music data with an error correction code to the headphone, a reproduction request detector configured to detect a reproduction request from the headphone, and a retransmission section configured to re-transmit requested music data to the headphone based on the reproduction request detected by the reproduction request detector, and the headphone comprising a receiver configured to receive music data transmitted from the audio player, an error detecting/correcting section configured to detect and correct an error of the music data received by the receiver and determine whether or not data retransmission is required, and a retransmission request section configured to, when the error detecting/correcting means determines that data retransmission is required, transmit a retransmission request to the audio player.

According to another aspect of the present invention, there is provided a music reproduction apparatus comprising an audio player and a pair of left and right headphones connected to the audio player via a wireless digital data transmission channel, the audio player comprising a transmitter configured to transmit left and right music data to the left and right headphones, and each of the left and right headphones comprising a receiver configured to receive the left and right music data transmitted from the audio player, and a data extracting section configured to extract one of the left and right music data received by the receiver.

According to another aspect of the present invention, there is provided a music reproduction apparatus comprising an audio player and a pair of left and right headphones connected to the audio player via a wireless digital data transmission channel, the audio player comprising a transmitter configured to transmit left and right music data to the left and right headphones respectively.

BRIEF DESCRIPTION OF THE SEVERAL VIEWS OF THE DRAWING

The accompanying drawings, which are incorporated in and constitute a part of the specification, illustrate embodiments of the present invention and, together with the general description given above and the detailed description of the embodiments given below, serve to explain the principles of the present invention in which.

DETAILED DESCRIPTION OF THE INVENTION

An embodiment of a music reproduction apparatus, an audio player, and a headphone according to the present invention will now be described with reference to the accompanying drawings.

FIRST EMBODIMENT

Figure 1A:
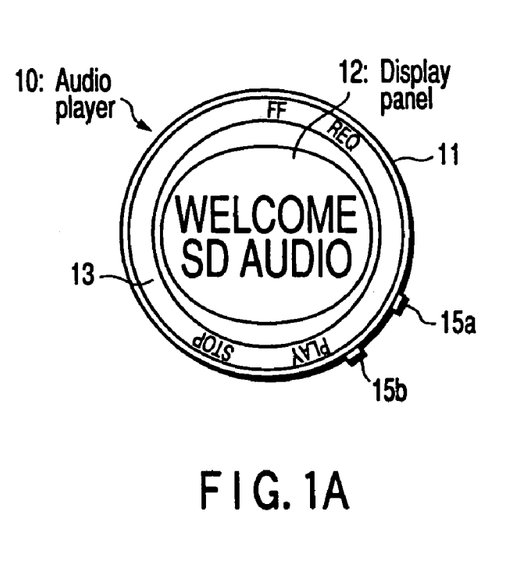
FIGS. 1A, 1B, 1C and 1D are views each showing an external configuration of an audio player according to a first embodiment of the present invention.
Figure 1B:
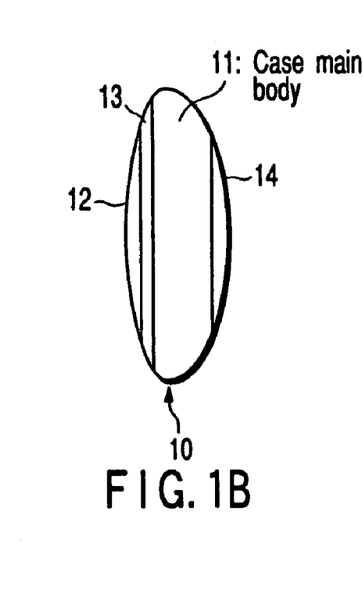
Figure 1C:
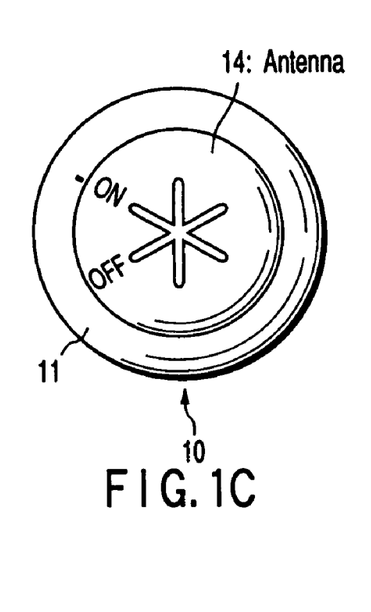
Figure 1D:
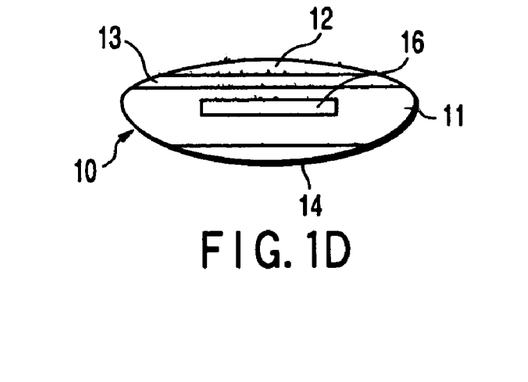
Figure 2A:
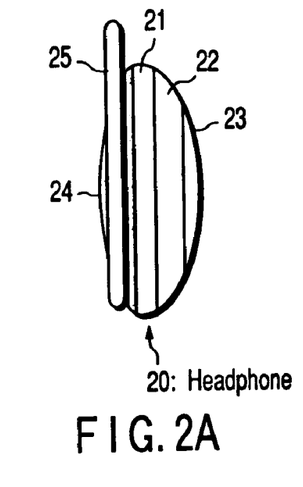
FIGS. 2A, 2B and 2C are views showing an external configuration of a headphone in the first embodiment.
Figure 2B:
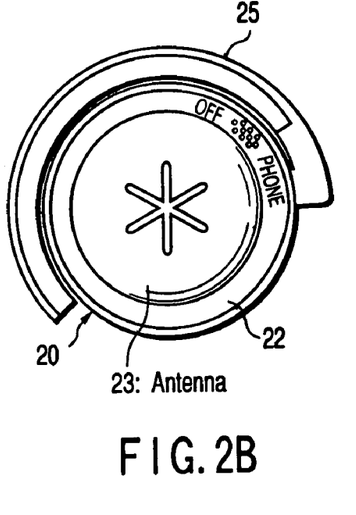
Figure 2C:
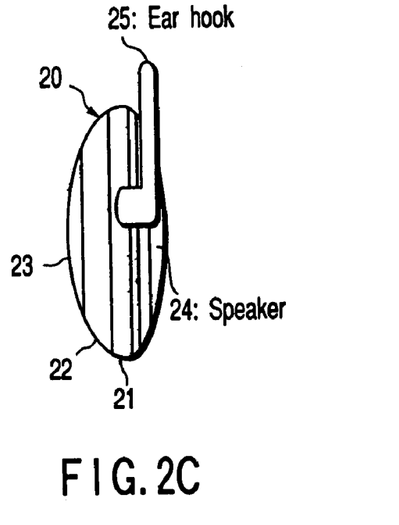

FIG. 1A to FIG. 1D are views each showing an external configuration of an audio player 10 according to the first embodiment of the present invention. FIG. 1A is a front view, FIG. 1B is a side view, FIG. 1C is a rear view, and FIG. 1D is a bottom view. FIG. 2A to FIG. 2C are external configurations of a right headphone 20. FIG. 2A is a left side view, FIG. 2B is a front view, and FIG. 2C is a right side view.

In the audio player 10 shown in FIG. 1A to FIG. 1D, an LCD display panel 12, for example, formed in a circular shape is provided at the front face side of a circular case main body 11, and a ring shaped audio operation switch 13 is rotatably provided at the outer periphery thereof. The audio operating switch 13 comprises a rotary switch, and can make operations for FF (fast feed), REW (rewinding), PLAY (playback), and STOP (stop), for example by rotating the switch. Volume control switches 15a and 15b are provided at the outside of the case main body 11. The switch 15a is a push button type switch for increasing a volume, and the switch 15b is a push button type switch for decreasing a volume.

A wireless communication antenna 14 for transmitting/receiving an electric wave is rotatably provided at the rear face side of the case main body 11, as shown in FIG. 1C. The antenna 14 comprises a rotary switch for turning ON/OFF transmission and reception of electronic waves. The rotary switch can be compatible with a power switch of the audio player.

A card slot 16 is provided at the lower side of the case main body 11, as shown in FIG. 1D. A small sized memory card or the like is mounted to the card slot 16. As a memory card, for example, a compact flash, a smart medium, or an SD (Secure digital) memory card may be used.

The audio player 10 reproduces music stored in the memory card, and transmits the reproduced digital music data to the headphone 20 via wireless communication. Bluetooth, for example, is used for wireless communication. Bluetooth is a specification for short distance wireless communication in which wireless communication within 10 m is generally carried out by using an ISM (Industry Science Medical) band of 2.4 GHz bandwidth. Bluetooth uses a frequency hopping system as a spread spectrum technique, and a maximum of eight devices can be connected by time division multiple system.

In the right headphone 20 shown in FIG. 2A to FIG. 2C, an antenna 23 is provided on one face of a circular case main body 21, and a ring shaped ON/OFF switch 22 is provided at the outer periphery thereof. The ON/OFF switch 22 comprises a rotary switch, and turns ON/OFF the power by rotationally operating the switch. A speaker 24 is provided on the other face of the case main body 21. An ear hook 25 is provided at the outside of the case main body 21. The ear hook 25 or case main body 21 incorporates a battery. The headphone 20 is connected to the audio player 10 via wireless communication, receives digital music data delivered from the audio player 10, converts the received data into an analog signal, and drives the speaker 24.

Although FIG. 2A to FIG. 2C show the right headphone 20, a left headphone is configured in the same manner.

Figures 3A, 3B:
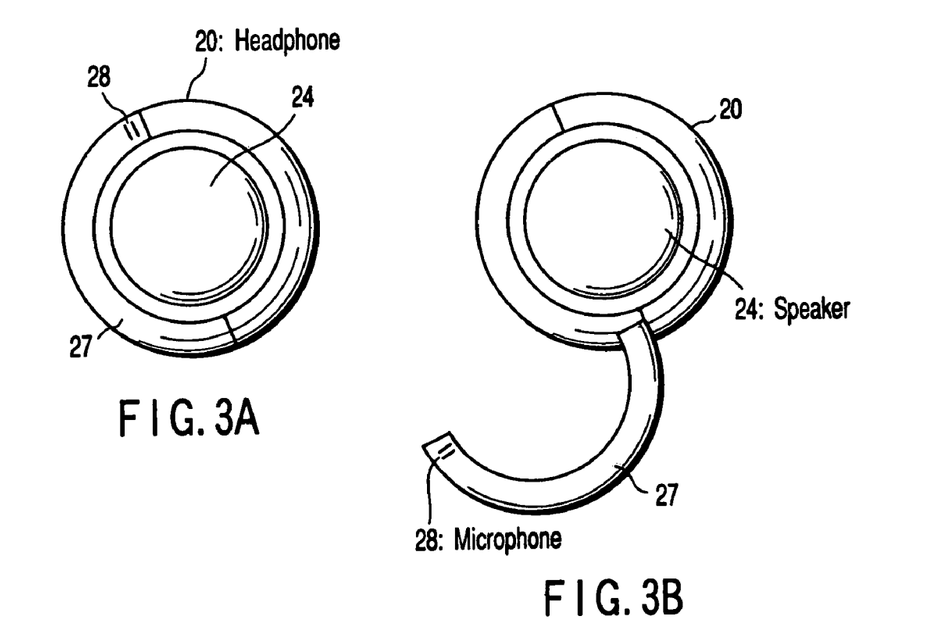
FIGS. 3A and 3B are views each showing an external configuration when a microphone is stored in a headphone.

FIG. 3A and FIG. 3B each show an exemplary configuration when a microphone 28 is provided at the headphone 20, and are views seen from the speaker 24 side. FIG. 3A shows a state when the microphone 28 is stored, and FIG. 3B shows a state when the microphone 28 is pulled out.

In the headphone 20, a microphone section 27 is provided at the outer periphery of the speaker 24. The microphone section 27 rotatably maintains one end of a semi-circular ring shaped microphone storage arm, and stores the microphone 28 at its tip end. At the outer periphery of the speaker 24, a semi-circular ring shaped member similar to the microphone section 27 is disposed at a position opposite to the microphone section 27, thereby maintaining aesthetic appeal. The headphone 20 comprises a switch for detecting a position of the microphone section 27. When the microphone 28 is pulled out, the pulled out microphone 28 is detected by the switch, and can be used as an earphone microphone. In general, the headphone 20 is used while the microphone 28 is stored as shown in FIG. 3A.

Figure 4:
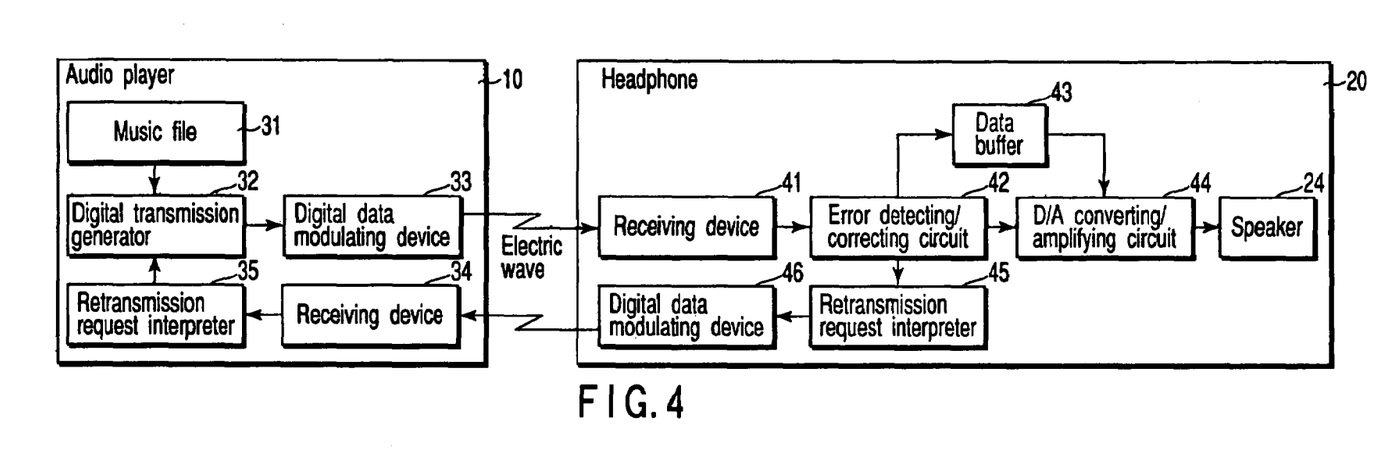
FIG. 4 is a block diagram showing a circuit configuration of the audio player and a headphone according to the first embodiment of the present invention.

An electronic circuit of the audio player 10 and headphone 20 will be described with reference to FIG. 4. The audio player 10 comprises a music file 31 which stores music data read out from a memory card; a digital transmission data generator 32 which generates digital transmission data from the music file 31; and a digital data modulating device 33 which modulates digital data, thereby transmitting the modulated data to the headphone 20 wirelessly. The audio player 10 further comprises a receiving device 34 which receives a retransmission request command delivered from the headphone 20; and a retransmission request interpreter 35 which interprets the retransmission request command received by the receiving device 34, thereby inputting the interpreted command to the digital transmission data generator 32.

The headphone 20 comprises a receiving device 41 which receives data delivered from the audio player 10; an error detecting/correcting circuit 42 which detects and corrects an error of the received signal; a data buffer 43 which stores the error corrected data; and a D/A converting/amplifying circuit 44 which converts and amplifies the digital data stored in the data buffer 43 sequentially into analog signals, thereby driving the speaker 24. The headphone 20 further comprises a retransmission request generator 45 which, in the case where an error cannot be corrected by the error detecting/correcting circuit 42 or in the case where some of the data cannot be received because the electric waves are interrupted, generates a retransmission request; and a digital data modulating device 46 which modulates the generated retransmission request, thereby transmits the request to the audio player 10.

In the above configuration, the audio player 10 generates digital transmission data based on the music file 31 at the digital transmission data generator 32, and modulates the generated data by the digital data modulating device 33, thereby wirelessly transmitting the modulated data to the headphone 20. An error correction code is added to data transmitted from the audio player 10.

The headphone 20 receives music data delivered from the audio player 10 by the receiving device 41, carries out error detection and error correction by the error detecting/correcting circuit 42, and stores the resultant data in the data buffer 43. The data stored in the data buffer 43 are sequentially read out to the D/A amplifying circuit 44, the read out data is converted into an analog signal, and is amplified, thereby driving the speaker 24.

In the case where an error cannot be corrected by the error detecting/correcting circuit 42 or in the case where some of the data cannot be received because the electric waves are interrupted, a command for generating a retransmission request is delivered from the error detecting/correcting circuit 42 to the retransmission request generator 45, and a retransmission request command is outputted from the retransmission request generator 45. The retransmission request command is modulated by the digital data modulating device 46, and the modulated command is delivered to the audio player 10.

The audio player 10 receives a retransmission request command delivered from the headphone 20 by the receiving device 34, interprets the received command by the retransmission request interrupting section 35, and instructs the digital transmission data generator 32 to retransmit data. The digital transmission data generator 32 retransmits data on a portion requested in accordance with the instruction from the retransmission request interpreter 35.

As has been described above, according to the first embodiment, the audio player 10 and headphone 20 are connected to each other via wireless communication, thus eliminating a connection cord, and freeing the user of cord problems. Because of this, the user can jog while listening to music. In the case of storing the audio player 10 and headphone 20 as well, the cord does not interrupt the user.

Digital music data is transmitted from the audio player 10 to the headphone 20, and thus, a high quality sound can be maintained without degrading a sound quality. The error detecting/correcting circuit 42 is provided at the headphone 20, thereby carrying out error detection and error correction. In addition, in the case where an error cannot be corrected by the error detecting/correcting circuit 42 or in the case where part of data cannot be received because electric waves are interrupted, a retransmission request is generated, thereby data on a portion requested from the audio player 10 is retransmitted. Thus, music data can be transferred without interruption or degradation. That is, the data corrected by the error detecting/correcting circuit 42 or retransmitted data is temporarily stored in the data buffer 43, and then, the temporarily stored data is read out sequentially by the D/A converting/amplifying circuit 44. Thus, even in the case data has been retransmitted, the data can be outputted to the speaker 24 without interruption.

Digital music data is transmitted wirelessly from the audio player 10 so that a plurality of people can listen to the same music by using a plurality of headphones 20. For example, in the case where Bluetooth is used as a wireless communication system, a maximum of eight persons can listen to the same music.

A wireless connection between the audio player 10 and the headphone 20 is provided, thereby providing a higher degree of freedom in the design and configuration of the audio player 10 and the headphone 20.

Other embodiments of the audio player according to the present invention will be described. The same portions as those of the first embodiment will be indicated in the same reference numerals and their detailed description will be omitted. That is, an external configuration of the audio player and headphone is identical to that of the first embodiment. Embodiments which are different in circuit configuration will be described below.

SECOND EMBODIMENT

Figure 5:
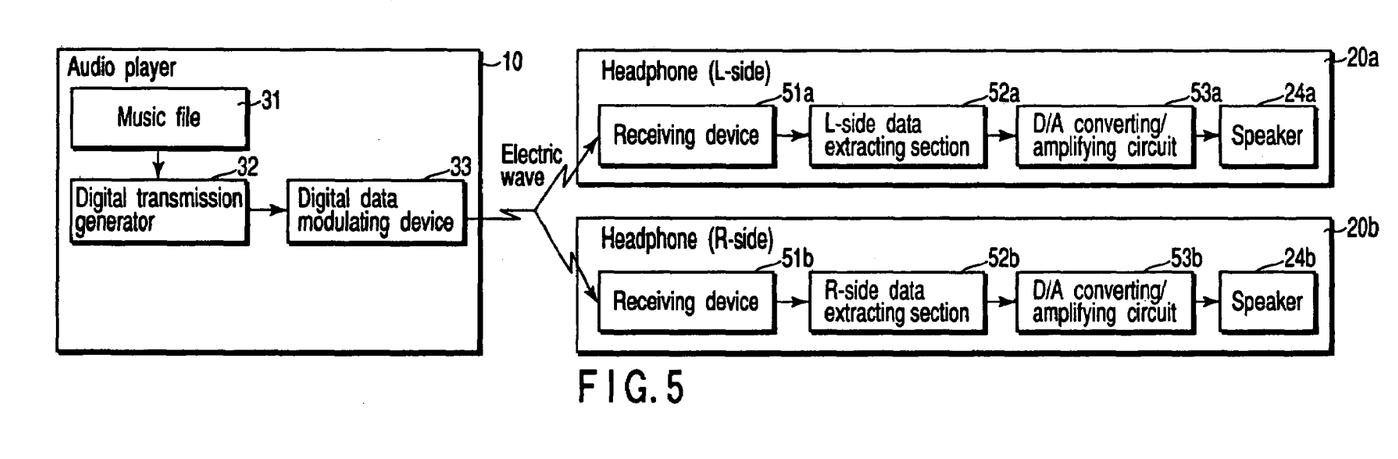
FIG. 5 is a block diagram showing a circuit configuration of an audio player and a pair of headphones according to a second embodiment of the present invention.

FIG. 5 shows a circuit configuration of an audio player 10 and a pair of headphones 20 according to the second embodiment of the present invention.

The audio player 10 generates stereo music data produced when L (left) and R (right) channels are mixed at the digital transmission data generator 32 to be outputted to the digital data modulating device 33. The digital data modulating device 33 modulates L and R mixed music data, and transmits the modulated data to an L-side headphone 20a and an R-side headphone 20b.

The L-side head phone 20a comprises a receiving device 51a, L-side data extracting section 52a, D/A converting/amplifying circuit 53a, and L-side speaker 24a. The L and R mixed music data received by the receiving device 51a is inputted to the L-side data extracting section 52a, and only the L-side data is extracted. Then, the L-side data is converted into an analog signal by the D/A converting/amplifying circuit 53a, and the converted signal is amplified, thereby driving the L-side speaker 24a.

Similarly, the R-side headphone 20b comprises a receiving device 51b, R-side data extracting section 52b, D/A converting/amplifying circuit 53b, and R-side speaker 24b. The L and R mixed music data received by the receiving device 51b is inputted to the R-side data extracting section 52b, and only the R-side data is extracted. Then, the R-side data is converted into an analog signal by the D/A converting/amplifying circuit 53b, and the converted signal is amplified, thereby driving the R-side speaker 24b.

The L-side data extracting section 52a and the R-side data extracting section 52b extract signals of L and R based on a code included in received data or extract the signals of L and R based on a time division system.

With the above configuration, the signals of L and R can be reliably separated at the headphones 20a and 20b, and the user can listen to stereo music.

THIRD EMBODIMENT

Figure 6:
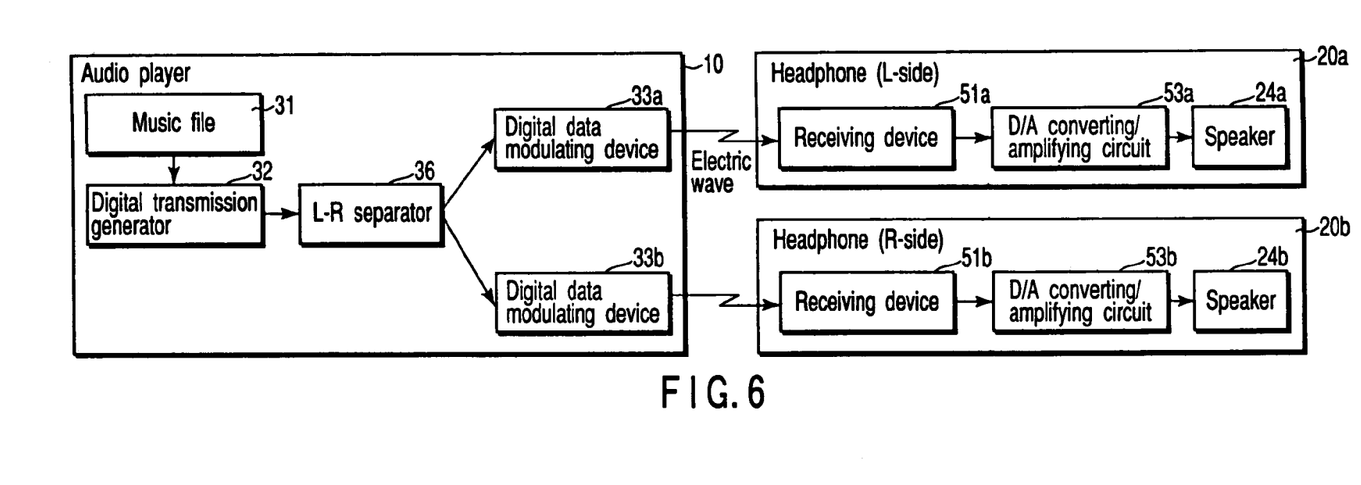
FIG. 6 is a block diagram showing a circuit configuration of an audio player and a pair of headphones according to a third embodiment of the present invention.

FIG. 6 shows a circuit configuration of the audio player 10 and the pair of headphones 20 according to the third embodiment of the present invention.

In the third embodiment, at the audio player 10, an L-R separator 36 is provided following to the digital transmission data generator 32, and signals of L and R are separated from the data outputted from the digital transmission data generator 32. The signal of L separated by the L-R separator 36 is inputted to a digital data modulating device 33a, and the signal of R is inputted to a digital data modulating device 33b. The digital data modulating devices 33a and 33b modulate signals separated by the L-R separator 36, and transmit the separated signals to the L-side headphone 20a and the R-side headphone 20b. The digital data modulating devices 33a and 33b transmit signals by using a frequency division system, for example.

The L-side headphone 20a comprises a receiving device 51a, a D/A converting/amplifying circuit 53a, and an L-side speaker 24a. The receiving device 51a selectively receives an L-side signal transmitted from the digital data modulating device 33a, and inputs the received signal to the D/A converting/amplifying circuit 53a. The D/A converting/amplifying circuit 53a converts the L-side signal received by the receiving device 51a into an analog signal, and amplifies the converted signal, thereby driving the L-side speaker 24a.

The R-side headphone 20b comprises a receiving device 51b, a D/A converting/amplifying circuit 53b, and an R-side speaker 24b. The receiving device 51b selectively receives an R-side signal transmitted from the digital data modulating device 33b, and inputs the received signal to the D/A converting/amplifying circuit 53b. The D/A converting/amplifying circuit 53b converts an R-side signal received by the receiving device 51b into an analog signal, and amplifies the converted signal, thereby driving the R-side speaker 24b.

In the third embodiment, the signals of L and R are separated at the audio player 10, and the separated signals are modulated and transmitted independently by digital data modulating devices 33a and 33b, respectively. Therefore, the pair of headphones 20a and 20b receives the signals of L and R separated in advance, the signals being transmitted from the audio player 10, and the user can listen to stereo music.

FOURTH EMBODIMENT

The fourth embodiment of the present invention will be described with reference to FIG. 7.

The fourth embodiment relates to a circuit configuration when the microphone 28 is stored in the headphone 20 as shown in FIG. 3A and FIG. 3B. As shown in FIG. 7, the microphone section 27 comprises the microphone 28, an A/D converting device 61, and digital data modulating device 62, and is configured so as to turn ON/OFF a power supply of the microphone section 27 by a detection signal from a microphone position detector 63.

The microphone position detector 63 outputs a power OFF signal while the microphone 28 is stored in the headphone 20 as shown in FIG. 3A, and outputs a power ON signal while the microphone 28 is pulled out as shown in FIG. 3B. Therefore, when the microphone 28 is pulled out from the headphone 20, the power ON signal is outputted from the microphone position detector 63, and the microphone section 27 operates. In this state, when a voice is inputted from the microphone 28, the voice signal is converted from an analog into a digital signal by the A/C converting device 61, the converted signal is modulated by the digital data modulating device 62, and the modulated data is transmitted to the audio player 10.

In the manner described above, the user's voice data can be transmitted from the headphone 20 to the audio player 10.

Figure 7:
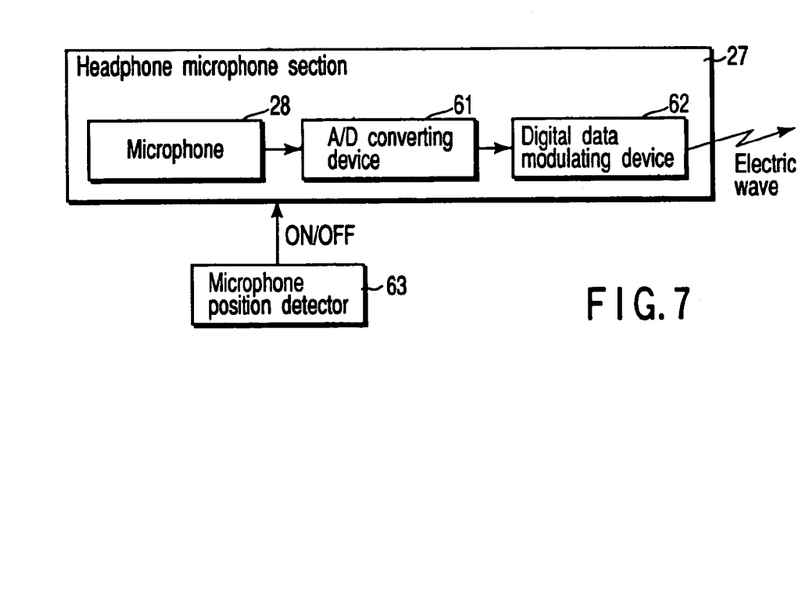
FIG. 7 is a block diagram showing a circuit configuration of a microphone section provided at a headphone according to a fourth embodiment of the present invention.

Although FIG. 7 describes a case where the digital data modulating device 62 transmits voice data to the audio player 10, the digital data modulating device 62 is connectable to a device other than the audio player 10 or a device having an I/F of the same electric waves as the audio player 10 such as a portable telephone/PHS, a personal computer, a television and the like. Therefore, the headphone 20 can be used in a method described below.

For example, when the headphone 20 is used by being wirelessly connected to the audio player 10, in the case where a portable telephone, PHS, or a home telephone (hereinafter, referred to as a portable telephone) is called, the fact that the portable telephone is called is transmitted by electric waves to the audio player 10 and the headphone 20. The audio player 10 temporarily stops reproduction automatically or reduces the volume, and the headphone 20 outputs from the speaker 24 a sound indicating that the portable telephone is called. At this time, the user pulls out the microphone 28 stored in the headphone 20, thereby starting operation as an earphone microphone of the portable telephone. When the portable telephone detects that the headphone 20 starts operation as an earphone microphone of the portable telephone, the current state goes from a called state to a talk state. When the audio player 10 detects that the headphone 20 starts as operation as an earphone microphone, reproduction is temporarily stopped.

Then, after the conversation is over, when the microphone 28 of the headphone 20 is stored, the headphone 20 restarts operation as a general headphone. When the portable telephone detects that an operation as a headphone is restarted, the telephone cuts out talking. When the audio player 10 detects that an operation as a headphone is restarted, the audio player restarts music reproduction that has been temporarily stopped.

As has been described above, talk processing can be carried out for a portable telephone by the microphone 28 of the headphone 20.

Otherwise, for example, while a portable telephone is waiting for a call, when it is detected that the headphone 20 starts operation as an earphone microphone, the portable telephone can execute processing that vocally recognizes voice data of the microphone 28 delivered from the headphone 20, and dials the counterpart.

FIFTH EMBODIMENT

The fifth embodiment of the present invention will be described with reference to FIG. 8.

The fifth embodiment relates to a circuit configuration when the headphone 20 is operated as a remote controller of the audio player 10.

Figure 8:
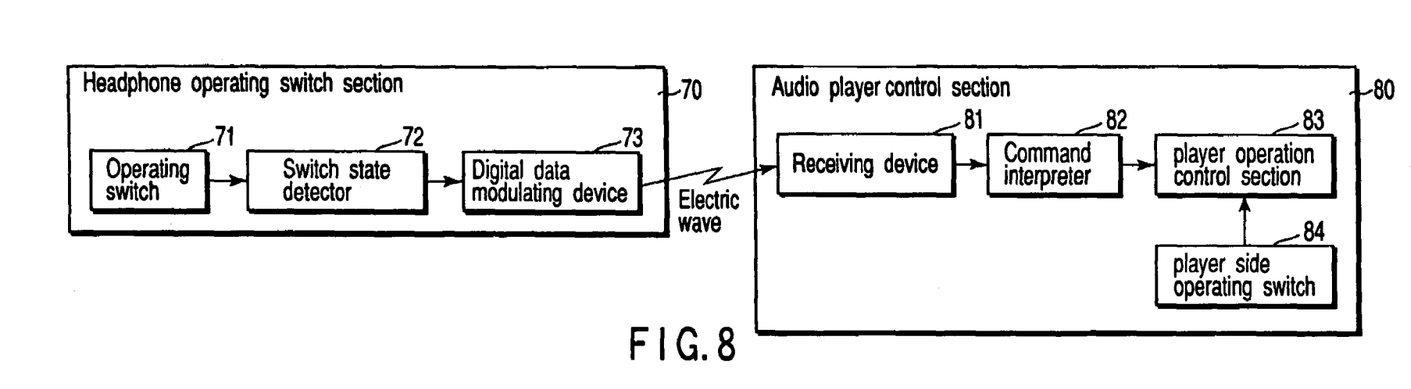
FIG. 8 is a block diagram showing a circuit configuration of an operating switch section of a headphone and a control section of an audio player according to a fifth embodiment of the present invention.

As shown in FIG. 8, an operating switch section 70 which operates the audio player 10 is provided at the headphone 20. The operating switch section 70 comprises operating switches 71 such as FF (fast, feed), REW (rewinding), PLAY (playback), STOP (stop), volume control and the like for operating the audio player 10; a switch state detector 72 which detects a state of the operating switches 71; a digital data modulating device 73 which modulates and delivers a command relevant to a switch detected by the switch state detector 72.

The audio player 10 receives an electric wave transmitted from the operating switch section 70 of the headphone 20 by a control section 80, and executes a control operation corresponding to the received signal. The control section 80 comprises a receiving device 81 which receives an electric wave transmitted from the digital data modulating device 73 of the operating switch section 70; a command interpreter 82 which interprets a command corresponding to the received signal by the receiving device 81, i.e., a command corresponding to the operating switch 71; and a player operation control section 83 which controls player operation in accordance with the interpreted command. The player operation control section 83 generally controls a player operation according to an operation of a player side operating switch 84.

In the above configuration, the operating switch 71 such as PLAY (playback), STOP (stop) or the like, for example, is operated at the headphone 20 side, and such a switching operation is detected by the switch state detector 72, and the command corresponding to the operating switch is delivered to the digital data modulating device 73. The digital data modulating device 73 modulates a command outputted from the switch state detector 72, and transmits the modulated command to the audio player 10. The audio player 10 receives the electric waves transmitted from the digital data modulating device 73 by the receiving device 81, interprets the content of the command by the command interpreter 82, and inputs the interpreted content to the player operation control section 83. The player operation control section 83 controls player operations such as PLAY (playback), STOP (stop) or the like in accordance with the command interpreted by the command interpreter 82.

As has been described above, the operating switch section 70 is provided at the headphone 20, whereby the headphone 20 can be operated as a remote controller of the audio player 10.

SIXTH EMBODIMENT

Figure 9:
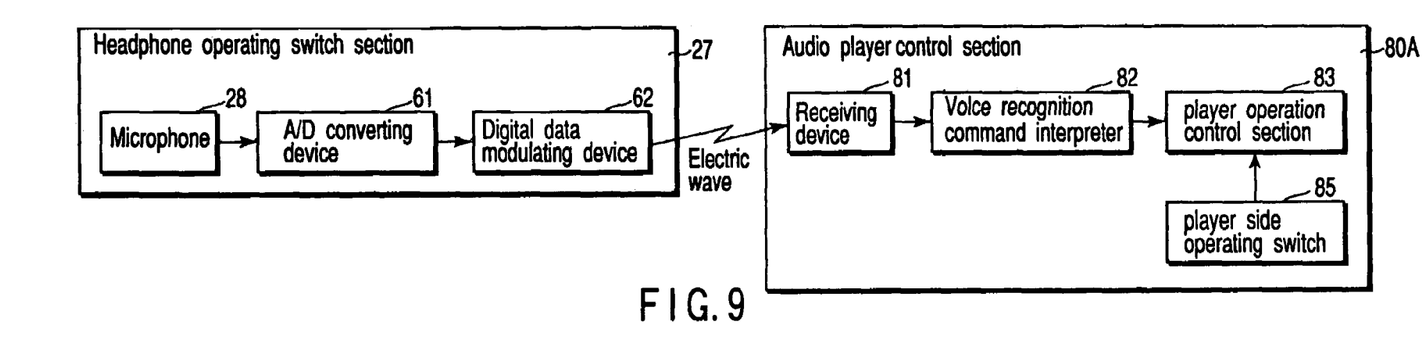
FIG. 9 is a block diagram showing a circuit configuration of a microphone section of a headphone and a control section of an audio player according to a sixth embodiment of the present invention.

The sixth embodiment relates to a circuit configuration when the headphone 20 is operated as a remote controller of the audio player 10 by using the microphone 28 of the headphone 20 and a voice recognition technique.

As shown in FIG. 9, the microphone section 27 shown in FIG. 7 is provided at the headphone 20. The microphone section 27 comprises the microphone 28, A/D converting device 61, and digital data modulating device 62.

The audio player 10 comprises a control section 80A similar to the control section 80 according to the fifth embodiment. The control section 80A comprises a voice command interpreter 85 provided instead of the command interpreter 82 in the control section 80.

In the case where the headphone 20 is operated as a remote controller, the microphone 28 is pulled out from the headphone 20, and the microphone vocally generates a predetermined operating command such as "reproduction" or "next music", for example, to the audio player 10. The voice data inputted to the microphone 28 is converted into digital data by the A/D converting device 61, and the converted data is transmitted to the control section 80A of the audio player 10 modulated by the digital data modulating device 62. The control section 80A receives the voice data delivered from the head phone 20 by the receiving device 81, interprets the received data by the voice command interpreter 82, and supplies the interrupted data to the player operation control section 83. The player operation control section 83 controls a player operation in accordance with the content interpreted by the voice command interpreter 82.

As has been described above, the microphone section 27 is provided at the headphone 20, and the voice command interpreter 82 is provided at the,control section 80A of the audio player 10, whereby a voice command is assigned from the microphone 28 of the headphone 20, making it possible to operate the audio player 10.

SEVENTH EMBODIMENT

The seventh embodiment of the present invention will be described with reference to FIG. 10.

The seventh embodiment relates to a circuit configuration when information on the battery level of the audio player 10 and the headphone 20 is exchanged, a no-battery warning sound or warning message is generated, and a battery level is displayed on the display panel 12 of the audio player 10.

Figure 10:
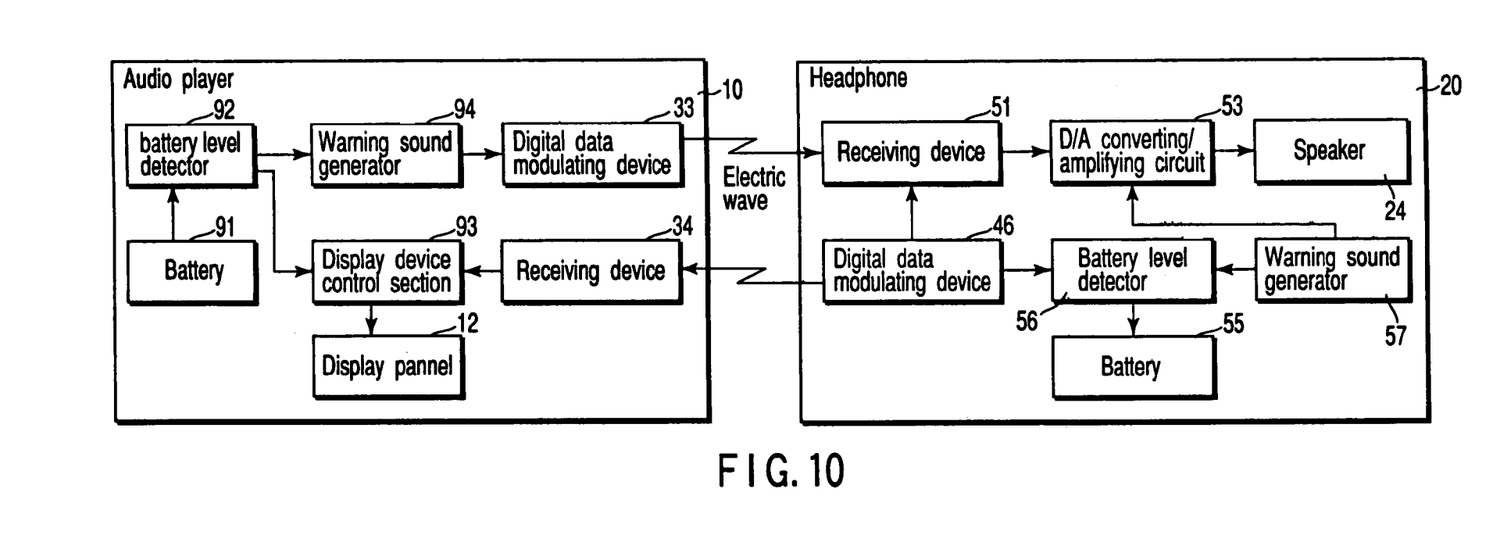
FIG. 10 is a block diagram showing a circuit configuration of an audio player and a headphone according to a seventh embodiment of the present invention.

As shown in FIG. 10, a battery level detector 92 which detects the level of a battery 91 is provided at the audio player 10. Information on the battery residue detected by the battery level detector 92 is delivered to a display device control section 93 to be displayed on the display panel 12. If the residue of the battery 91 is below a predetermined value, the battery level detector 92 detects such state, and outputs a warning sound generating command to a warning sound generator 94. The warning sound generator 94 generates a warning sound or a warning message in accordance with a command from the battery level detector 92, modulates the sound or message by the digital data modulating device 33, and transmits it to the headphone 20.

The headphone 20 receives the warning sound or warning message transmitted from the audio player 10 by the receiving device 51, and converts the sound or message into an analog signal by the D/A converting/amplifying circuit 53, thereby driving the speaker 24. The headphone 20 detects the residue of an incorporated battery 55 by a battery level detector 56, and outputs a warning sound generating command to a warning sound generator 57 when the battery residue is below a predetermined value. The warning sound generator 57 generates a warning sound in accordance with a command from the battery level detector 56, and outputs the generated sound from the speaker 24 via the D/A converting/amplifying circuit 53.

The residue information on the battery 55 detected by the battery level detector 56 is modulated by the digital data modulating device 46, and the modulated information is transmitted to the audio player 10. The audio player 10 receives the battery residue information delivered from the headphone 20 by the receiving device 34, outputs the received information to a display device control section 93, and displays the outputted information on the display panel 12.

With the above configuration, information on the battery level of the audio player 10 and the headphone 20 is exchanged, a no-battery warning sound or a warning message is generated, and the battery residue can be displayed on the display panel 12 of the audio player 10.

EIGHTH EMBODIMENT

The eighth embodiment of the present invention will be described with reference to FIG. 11.

The eighth embodiment relates to a circuit configuration when the headphone 20 approximately measures a distance to the audio player 10 by using electric waves, and a warning sound is outputted from the speaker 24 when the distance exceeds a predetermined distance.

Figure 11:
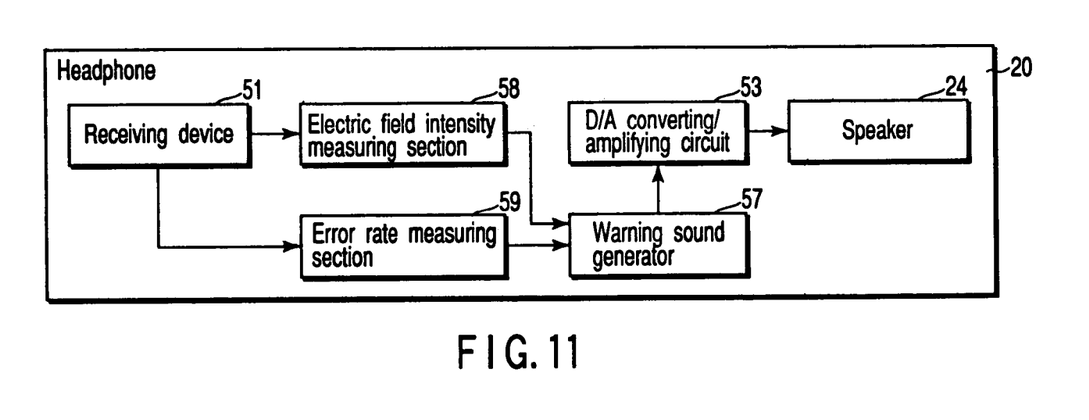
FIG. 11 is a block diagram showing a circuit configuration of a headphone according to an eighth embodiment of the present invention.

As shown in FIG. 11, the headphone 20 comprises an electric field intensity measuring section 58 and an error rate measuring section 59, receives transmission electric waves from the audio player 10 by the receiving device 51, and inputs the received signal to the electric field intensity measuring section 58 and error rate measuring section 59. The electric field intensity measuring section 58 measures an electric field intensity from a level of the received signal, estimates a distance to the audio player 10 from its electric field intensity, and outputs a warning sound generating command to the warning sound generator 57 when the estimated distance exceeds a predetermined distance or the detected electric field intensity is lower than a predetermined value.

The error rate measuring section 59 measures an error rate of received information based on an error detection code included in the transmitted information from the audio player 10, estimates a distance with the audio player 10 from the result, and outputs a warning sound generating command to the warning sound generator 57 when the estimated distance exceeds a predetermined distance or the detected error rate is higher than a predetermined value.

The warning sound generator 57 generates a warning sound in the case where a warning sound generating command is generated from the electric field intensity measuring section or error rate measuring section 59, and outputs the warning from the speaker 24 via the D/A converting/amplifying circuit 53.

As described above, the electric field intensity measuring section 58 and the error rate measuring section 59 are provided at the headphone 20, and a distance to the audio player 10 is measured, whereby a warning sound can be outputted from the speaker 24 in the case where the distance with the audio player 10 exceeds a predetermined distance. Therefore, for example, in the case where an attempt to move while the audio player 10 is set down somewhere, a warning sound sounds. As a result, the mislaying of the audio player 10 can be prevented. Similarly, the theft of the audio player 10 can be effectively prevented.

Although the above described embodiments show a case where the audio player 10 is connected to the headphone 20, the audio player can be connected to another device by using electric waves as well as the headphone 20. For example, connection is made to another audio player or personal computer having an I/F of the same electric waves as the audio player 10, and a music file owned by each of these elements can be transmitted/received. The audio player 10 is connected to a portable telephone having an I/F of the same electric waves as the audio player 10, thereby making it possible to download a music file over the Internet via this portable telephone.

As has been described above in detail, according to aspects of the present invention, digital music data is transmitted from the audio player to the headphone, and thus, a high quality sound can be maintained. The error detecting/correcting circuit is provided at the headphone, thereby carrying out error correction. In the case where error correction cannot be carried out or in the case where some of the data cannot be received because electric waves are interrupted, data is retransmitted, thus making it possible to reliably prevent interruption or degradation of the music data Further, digital music data is transmitted wirelessly from the audio player, and a plurality of people can listen to the same music by using a plurality of headphones. Each of the audio player and the headphone comprise a transmitting/receiving device, thus making it possible to facilitate the audio player or headphone operating as an electronic device having another purpose as well as music data transmission/receiving.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A music reproduction apparatus comprising an audio player and a headphone connected to said audio player via a wireless digital data transmission channel, said audio player comprising:
   - a transmitter configured to transmit music data with an error correction code to said headphone;
   - a reproduction request detector configured to detect a reproduction request from said headphone; and
   - a retransmission section configured to re-transmit requested music data to said headphone based on the reproduction request detected by said reproduction request detector, and said headphone comprising:
   - a receiver configured to receive music data transmitted from said audio player;
   - an error detecting/correcting section configured to detect and correct an error of the music data received by said receiver and determine whether or not data retransmission is required; and
   - a retransmission request section configured to, when said error detecting/correcting means determines that data retransmission is required, transmit a retransmission request to said audio player.

* * * * *